(12) United States Patent
Nemoto (10) Patent No.: US 6,686,660 B2
(45) Date of Patent: Feb. 3, 2004

(54) SEMICONDUCTOR DEVICE (75) Inventor: Yoshihiko Nemoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/303,737

(22) Filed: Nov. 26, 2002

(65) Prior Publication Data
US 2003/0214038 A1 Nov. 20, 2003

(30) Foreign Application Priority Data
May 20, 2002 (JP) ........................................ 2002-145333

(51) Int. Cl.[7] .............................................. H01L 29/40
(52) U.S. Cl. ........................................ 257/737; 257/778
(58) Field of Search ................................. 257/737, 738, 257/778

(56) References Cited

U.S. PATENT DOCUMENTS 5,656,858 A * 8/1997 Kondo et al. ............... 257/737

FOREIGN PATENT DOCUMENTS

| JP | 02-276249 | 11/1990 |
|----|-----------|---------|
| JP | 11-40745 | 2/1999 |
| JP | 11-214421 | 8/1999 |

* cited by examiner

Primary Examiner—Roy Potter
(74) Attorney, Agent, or Firm—McDermott, Will & Emery (57) ABSTRACT The bump underlying metal film has a first metallic deposit film formed by a first electroless plating method, and a second metallic deposit film formed on the first metallic deposit film by a second electroless plating method using a plating solution different in type from that used in the first electroless plating method. The bump underling metal film is so arranged that the first metallic deposit film has a thickness larger than the organic insulating film, and the first metallic deposit film has a peripheral portion superposed on the organic insulating film.

3 Claims, 6 Drawing Sheets

SEMICONDUCTOR DEVICE

BACKGROUND OF THE INVENTION

1. Field of the Invention

The present invention relates to a semiconductor device, and more particularly, to a semiconductor device having an electrode formed on a semiconductor substrate provided with a semiconductor integrated circuit and electrically connected to the semiconductor integrated circuit, an organic insulating film formed on the semiconductor substrate and having an opening through which the electrode is exposed, and a bump electrode formed on the electrode via a bump underlying metal film.

2. Background Art

In general, semiconductor devices have an external electrode for electric connection to outside. In recent years, from the standpoint of miniaturization and high performance of electronic appliances, high density mounting techniques, such as a flip chip system, have been put into practice, and these systems essentially require a bump (metallic protrusion) as an electrode for semiconductor devices. For a material of the external electrode of semiconductor devices, aluminium is usually employed. In this case, a bump electrode is formed on the aluminium electrode via a bump underlying metal film. One of methods of forming the bump underlying metal film includes an electroless plating method.

Figure 4:
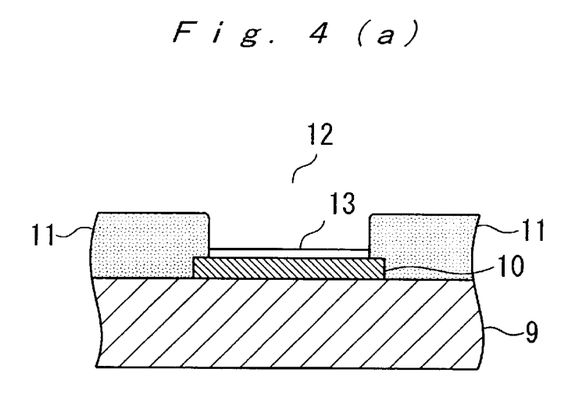

Referring now to FIG. 4, an instance of the steps of an electroless plating method will be described. A semiconductor device of FIG. 4 has such an arrangement that an aluminium electrode is formed on a silicon substrate formed with a semiconductor integrated circuit thereon, after which a polyimide film is formed as an insulating film, and an aluminium electrode is connected to outside via the opening formed at a given portion of the polyimide film.

FIG. 4(a) shows the formation, on a silicon substrate 9, of an aluminium film serving as an aluminium electrode 10 and a polyimide film 11 used as an insulating film. As shown in the figure, for connection of an external electrode to outside, the aluminium electrode 10 is exposed to through an opening 12 formed in position of the polyimide film 11, so that an oxide film 13 is formed on the surface of the aluminium electrode 10 by natural oxidation. In this condition, treatment is carried out so that the oxide film 13 is removed to activate the surface thereof. More particularly, wet etching is performed, for example, by immersion in an aqueous solution of phosphoric acid or sodium hydroxide. Further, a zincate treatment is effected wherein fine particles of zinc are deposited on the surface of the aluminium electrode 10 through substitution reaction.

Next, after cleaning with water, the semiconductor device is subjected to electroless plating by immersion in an electroless plating solution while heating to and keeping at 80° C. by means of a heater, thereby providing a structure of FIG. 4(b). The electroless plating solution used is, for example, an electroless nickel (Ni) plating solution using sodium hypophosphite as a reducing agent. According to this step, phosphorus (P)-containing nickel precipitates from the fine particles of zinc on the aluminium surface, thereby forming an alloy film 14 of nickel and phosphorus (hereinafter referred to as Ni—P film). At this stage, the Ni—P film 14 should be formed in such a way that its thickness is smaller that that of the polyimide film 11 as is particularly depicted in FIG. 4(b).

After cleaning of the semiconductor device with water of room temperature after completion of the nickel plating, the semiconductor device is subjected to electroless gold plating by immersion of the device in an electroless gold (Au) plating solution heated to and kept at 60° C. by means of a heater to provide a structure of FIG. 4(c). In this step, a gold film (hereinafter referred to as Au film) 15 is formed on the Ni—P film 14 by substitution reaction with the gold ions in the electroless gold plating solution. The reason why the Au film 15 is formed on the Ni—P film 14 is that when using the Ni—P film 14 alone, connection becomes poor due to the existence of the oxide film formed on the surface and is enhanced by the provision of the Au film 15. Accordingly, the thickness of the Au film 15 is made very thin relative to the thickness of the Ni—P film 14. After the formation of the Au film 15, the semiconductor device is cleaned with water to complete the electroless plating steps.

Figure 5:
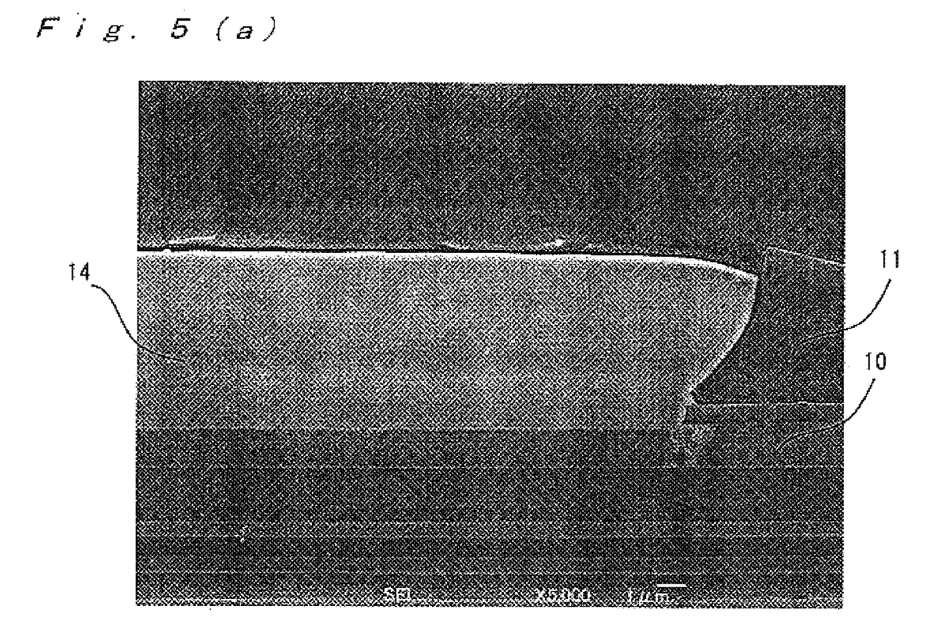

However, such an electroplating step as set out above has the following problem. As stated hereinabove, nickel plating is carried out by immersion in a nickel plating solution at a temperature of about 80° C. and subsequent gold plating is carried out by immersion in a gold plating solution at a temperature of about 60° C. On the other hand, when the polyimide film is compared with the Ni—P film with respect to the coefficient of thermal expansion, the polyimide film has a coefficient of thermal expansion of $5 \times 10^{-5}/°$ C. and that of the Ni—P film is at $13 \times 10^{-6}/°$ C., for one instance. In general, since the polyimide film has a coefficient of thermal expansion that is larger by one order of magnitude than that of the Ni—P film, the polyimide film is larger than the Ni—P film with respect to the shrinking rate ascribed to the temperature difference between the nickel plating solution and the gold plating solution. Accordingly, where the gold plating is carried out subsequently to the nickel plating, there is the possibility that the polyimide film separates from the Ni—P film depending on the difference in shrinking rate between the polyimide film and the Ni—P film caused by the temperature difference between the nickel plating solution and the gold plating solution, thereby causing an interstice or interstitial space to be created at the interface between the polyimide film and the Ni—P film. When the gold plating is performed in such a state as to cause the interstitial space, the gold plating solution infiltrates from the space and arrives at the aluminium electrode, with the attendant problem that the acid component contained in the gold plating solution acts to corrode the aluminium electrode. Reference is now made to FIG. 5 to describe this phenomenon in more detail.

FIG. 5 is an electron photomicrograph by SEM (scanning electron microscope) of the semiconductor device obtained after the gold plating. Because the Au film is very thin, any Au film cannot be confirmed in the photograph. FIG. 5(a) shows the state where the polyimide film 11 and the Ni—P film 14 are formed on the aluminium electrode 10. On the other hand, FIG. 5(b) is an enlarged view of FIG. 5(a) with respect to an interface $S_3$ between the polyimide film 11 and the Ni—P film 14. From FIG. 5(b), it will be seen that an interstitial space 16 is observed at the interface $S_3$ between the polyimide film 11 and the Ni—P film 14, and the aluminium electrode 10 beneath the space 16 is corroded. When the aluminium electrode 10 is corroded in this way, the electric characteristics and reliability of the resultant semiconductor device lower, with the problem that yield lowers.

Figure 6:
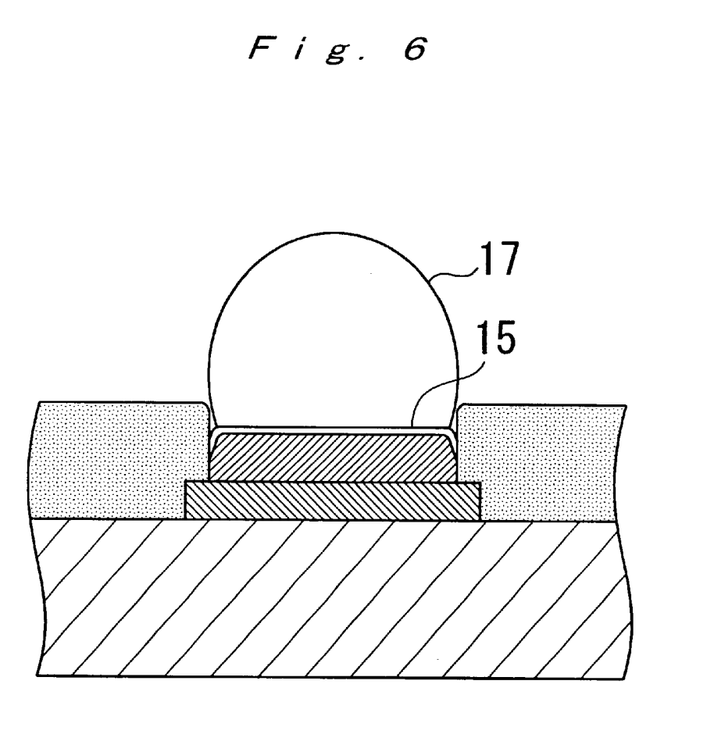
FIG. 6 is a sectional view of a solder bump formed on a bump underlying metal film in a conventional semiconductor device.

FIG. 6 show an example of forming a solder bump on a bump underlying metal film formed according to a conventional electroless plating procedure. The end portion of the face where a solder bump 17 is in contact with the second metallic deposit film 15 corresponds to the vicinity of the interface between the polyimide film 11 and the Ni—P film 10. Accordingly, stress is concentrated on this portion, with the attendant problem that such concentration leads to the breakage of the electrode.

SUMMARY OF THE INVENTION

The invention has been made in order to overcome these problems. More particularly, the invention provides a semiconductor device wherein the corrosion of the electrode caused through the interstitial space created at the interface between an organic insulating film and a metallic deposit film can be prevented, thereby providing excellent electric characteristics and reliability.

The present invention relates to a semiconductor device comprising: an electrode formed on a semiconductor substrate provided with a semiconductor integrated circuit and electrically connected to the semiconductor integrated circuit; an organic insulating film formed on the semiconductor substrate and having an opening through which the electrode is exposed: and a bump electrode formed on the electrode through a bump underlying metal film. According to one aspect of the present invention, in the semiconductor device; the bump underlying metal film includes a first metallic deposit film formed by a first electroless plating method and a second metallic deposit film formed on the first metallic deposit film by a second electroless plating method using a plating solution different in type from that of the first electroless plating method. The first metallic deposit film has a thickness larger than said organic insulating film. The first metallic deposit film is so formed that a peripheral portion thereof is superposed on the organic insulating film.

Other and further objects, features and advantages of the invention will appear more fully from the following description.

BRIEF DESCRIPTION OF THE DRAWINGS

FIG. 1(*a*) is a sectional view of a semiconductor device according to a first embodiment.

FIG. 1(*b*) is a sectional view of a semi conductor device according to a first embodiment.

FIG. 1(*c*) is a sectional view of a semiconductor device according to a first embodiment.

FIG. 4(*a*) is a sectional view of a conventional semiconductor device.

FIG. 4(*b*) is a sectional view of a conventional semiconductor device.

FIG. 4(*c*) is a sectional view of a conventional semiconductor device.

FIG. 5(*a*) is an electron photomicrograph by SEM of a sectional view of a conventional semiconductor device.

FIG. 5(*b*) is an electron photomicrograph by SEM of a corroded electrode in a conventional semiconductor device.

DESCRIPTION OF THE PREFERRED EMBODIMENTS

The embodiments of the invention will be described in detail with reference to the accompanying drawings.

First Embodiment

Figure 1A:
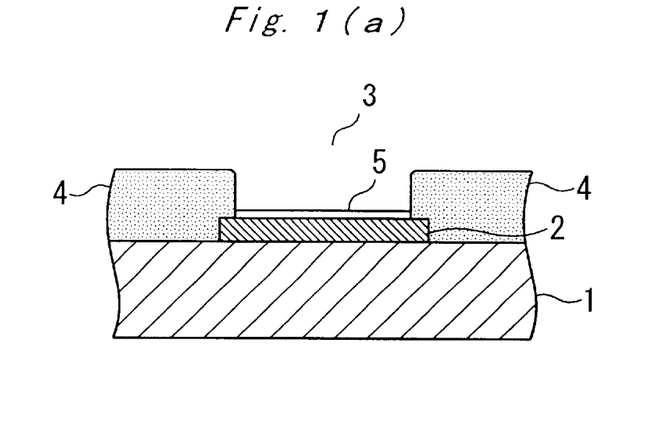

Referring now to FIG. 1, the electroless plating step according to this embodiment will be described. After forming a plurality of electrodes 2 on a semiconductor substrate 1, on which semiconductor integrated circuits such as various types of transistors, wirings and the like are formed, an insulating film 4 having an opening 3 through which the electrode 2 is exposed, thereby providing a structure of FIG. 1(*a*). For the insulating film, an organic insulating film made of an organic material, such as a polyimide, is used.

On the other hand, a silicon substrate may be used, for example, as the semiconductor substrate of this embodiment. For the electrode, mention may be made, for example, of an aluminium electrode made of an aluminium film. The electric characteristics of the electrodes may be the same or different on the semiconductor substrate as a whole. For instance, electrodes having different potentials may be formed on the same semiconductor substrate.

Next, an oxide film 5 formed on the surface of the electrode 2 is removed from the surface so as to activate the surface. The oxide film is etched by use, for example, of an acid such as sulfuric acid, hydrochloric acid, phosphoric acid, hydrofluoric acid or the like, or an alkali such as sodium hydroxide, sodium phosphate, sodium silicate, sodium carbonate or the like. Thereafter, an alkaline solution containing zinc ions is used for zincate treatment. Where an aluminium electrode is used, a substitution reaction takes place owing to the difference in electrode potential between aluminium and zinc to cause fine particles of zinc to be deposited on the surface of the aluminium film.

The removal of the oxide film 5 and the zincate treatment may be carried out simultaneously. For instance, while the zincate treatment is effected in an alkaline solution containing zinc ions, the oxide film 5 may be removed.

Figure 1B:
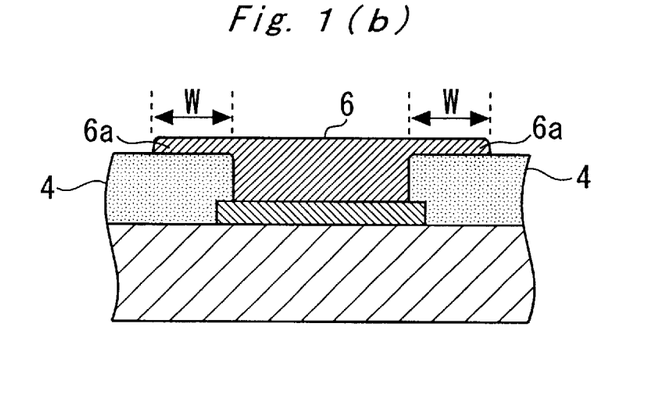

After cleaning with water after the zincate treatment, electroless plating treatment is carried out to form a first metallic deposit film 6 on the electrode 2 which is exposed from the opening 3. For instance, electroless plating is performed such that an electroless nickel solution containing a nickel salt and a hypophosphite is used, and the semiconductor device is immersed in the electroless nickel solution heated to and maintained at 80° C. by means of a heater, thereby forming an Ni—P film.

In a prior art method, the first metallic deposit film is so arranged that it has a thickness smaller than that of an organic insulating film. In contrast, this embodiment is characterized in that the first metallic deposit film 6 is made larger in thickness than the organic insulating film 4 as is particularly shown in FIG. 1(*b*) and the first metallic deposit film 6 is so formed that its peripheral portion 6a is overlaid over the organic insulating film 4. The thickness of the organic insulating film 4 should preferably be at 3~14 μm, and the thickness of the first metallic deposit film 6 should preferably be at 4~15 μm. The area where the first metallic deposit film 6 and the organic insulating film 4 are superposed is determined by setting an appropriate width of superposition (as W in FIG. 1(*b*)) for every design rule of individual semiconductor devices. If the superposed area is too small, the effect of the invention cannot be obtained satisfactorily. If the superposed area is too large, short-circuiting between adjacent electrodes may take place. Thus, an appropriate width W of superposition should be set therebetween.

Figure 1C:
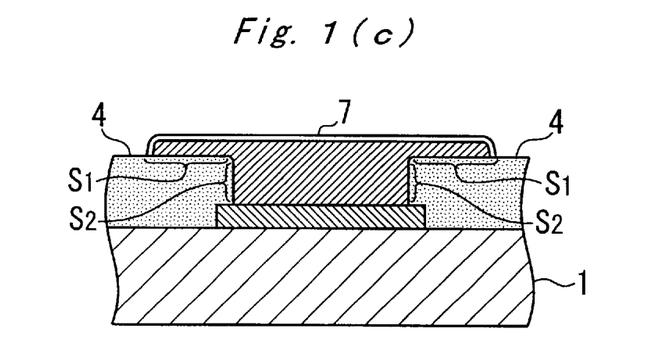

Next, after cleaning of the semiconductor device, obtained after formation of the first metallic deposit film, with water of room temperature, a second metallic deposit film 7 is formed to provide a structure of FIG. 1(*c*). For instance, after the formation of the Ni—P film, the semiconductor device is immersed in an electroless gold plating solution heated to and maintained at 60° C. by means of a heater to carry out electroless gold plating treatment, thereby forming an Au film. Thereafter, the semiconductor device is cleaned with water to complete the electroless plating steps. According to the steps set out above, the bump underlying metal film (Ni—P/Au metallic deposit films) is formed on the metal 2.

The first metallic deposit film having such a structure as in this embodiment has the following effects.

For instance, as seen in the case where electroless gold plating is performed subsequently to the electroless nickel plating, where the temperature difference between the first plating solution and the second plating solution is provided, the difference in volumetric shrinkage between the insulating film and the first metallic deposit film causes a strain at the interface therebetween, thereby establishing an internal stress and thus reducing bonding strength. In general, with respect to the bonding force between the Ni—P film and the insulating film, the case using an insulating film such as of polyimide is smaller than the case where an inorganic insulating film, such as of silicon dioxide, is used. This is for the reason that the organic insulating film exhibits a larger difference in coefficient of thermal expansion from the Ni—P film, which is made of an inorganic material, than an inorganic insulating film. In general, although an inorganic insulating film is not formed in a thickness exceeding 3 $\mu$m, an organic insulating film is frequently formed in a thickness exceeding 10 $\mu$m. Accordingly, where an organic insulating film is used, an internal stress produced becomes larger than in the case using an inorganic insulating film, and bonding strength becomes smaller than that of a case using an inorganic insulating film. Thus, the bonding force cannot withstand the internal stress, thereby causing separation at the interface.

The separation phenomenon ascribed to the development of the internal stress is liable to occur at the interface $S_3$ where the first metallic deposit film 6 has a large thickness as shown in FIG. 5. On the other hand, at the interface $S_1$ between the first metallic deposit film 6 formed on the organic insulating film 4 and the organic insulating film 4 as shown in FIG. 1(c), the internal stress becomes small because of the small thickness of the first metallic deposit film 6. Accordingly, even if separation takes place at the interface $S_2$ (corresponding to the interface $S_3$ in FIG. 5), no separation takes place at the interface $S_1$.

For the reason stated hereinabove, even if an interstitial space is caused at the interface $S_2$ due to the separation, no space is formed at the interface $S_1$, In this condition, the first metallic deposit film 6 formed on the organic insulating film 4 serves just as a cover and can prevent the second plating solution from arriving at the aluminium film 1 through the space created at the interface $S_2$. Accordingly, the electrode 2 is not corroded by the action of the second plating solution.

Figure 2:
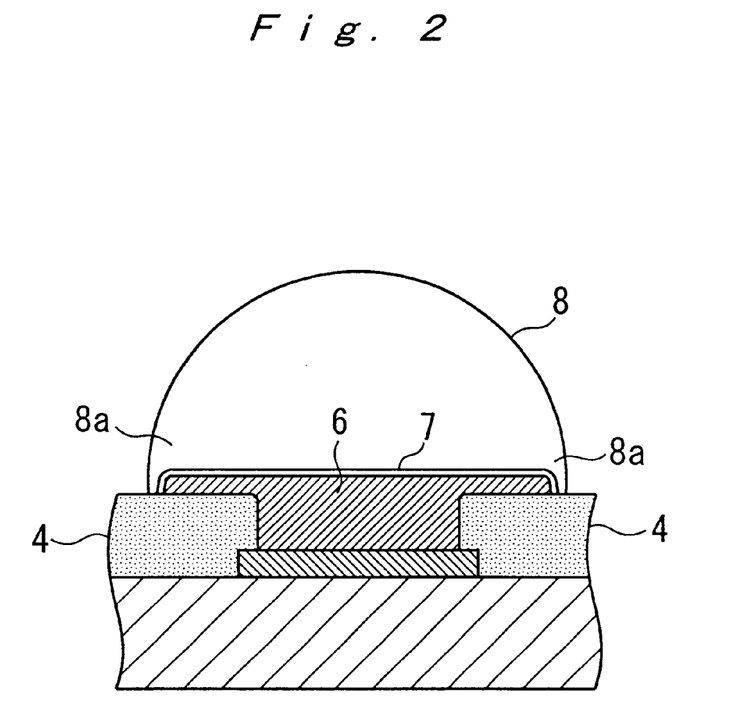
FIG. 2 is a sectional view forming a solder bump on the bump underlying metal film formed by the electroless plating step according to a first embodiment.

FIG. 2 shows an example of forming a solder bump on the bump underlying metal film formed by the electroless plating step according to this embodiment. A peripheral portion 8a of a solder bump 8 at a side that is in contact with the second metallic deposit film 7 corresponds to the portion where the first metallic deposit film 6 and the second metallic deposit film 7 are, respectively, formed on the organic insulating film 4. Accordingly, such a phenomenon of causing the breakage of the electrode owing to the stress concentrated at the interface between the insulating film and the first metallic deposit film, like the prior art counterpart (FIG. 6), can be avoided. Moreover, because the underlying organic insulating film 4 has a relatively large modulus of elasticity, the internal stress at the peripheral portion 8a of the solder bump 8 can be mitigated.

In this embodiment, an instance has been shown wherein the first and second metallic deposit films are applied to as a bump underlying metal, to which the invention is not limited. For instance, the invention may be applied to a bump electrode per se, which is used for TAB (tape automated bonding) or also for mounting using an anisotropic conductive film.

For the electrode of the embodiment, mention has been made of an aluminium electrode, but electrodes may be made of other types of metals provided that they have electric conductivity and are usable as an electrode. In addition, those electrodes which are made of an appropriate type of material covered with a metal may also be used.

Second Embodiment

Figure 3:
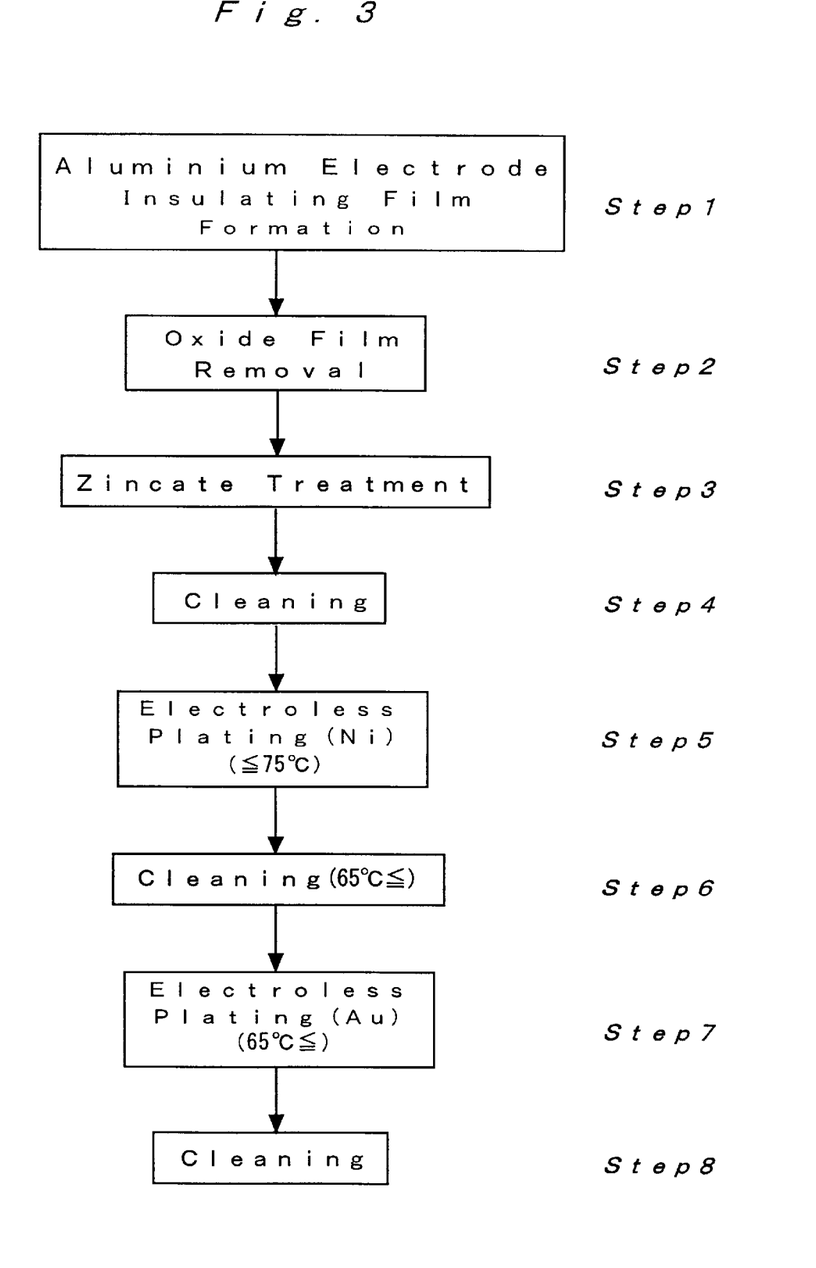
FIG. 3 shows electroless plating steps according to a second embodiment.

FIG. 3 shows electroless plating steps according to this embodiment. Initially, after formation of electrodes on a semiconductor substrate in which semiconductor integrated circuits, such as various types of transistors, wirings and the like, are formed according to a known method, an insulating film having an opening through which the electrode is exposed is formed (step 1). The insulating film used consists of an organic insulating film made of an organic material such as a polyimide.

On the other hand, the semiconductor substrate used in the embodiment includes, for example, a silicon substrate. For the electrode, an aluminium electrode made of an aluminium film may be used, for example. The electric characteristics of all of the electrodes may be the same or different on the semiconductor substrate. For instance, electrodes having different potentials may be formed on the same semiconductor substrate.

Next, such a treatment is performed that the oxide film formed on the surface of the electrode is removed to activate the surface (step 2). For instance, etching is carried out by use of an acid such as sulfuric acid, hydrochloric acid, phosphoric acid, hydrofluoric acid or the like, or an alkali such as sodium hydroxide, sodium phosphate, sodium silicate, sodium carbonate or the like. Thereafter, a zincate treatment is carried out using an alkaline solution containing zinc ions (step 3). Where an aluminium electrode is used, a substitution reaction occurs based on the difference in electrode potential between aluminium and zinc, thereby permitting fine particles of zinc to be deposited on the surface of the aluminium film.

It will be noted that the steps 2 and 3 may be conducted simultaneously. For instance, while the zincate treatment is carried out in an alkaline solution containing zinc ions, the oxide film may be removed from the surface of the aluminium film.

After cleaning with a cleaning fluid after the zincate treatment (step 4), electroless plating is performed to form a bump underlying metal film. This embodiment is characterized in that the first plating solution, the second plating solution and the cleaning fluid have a temperature difference set at 15° C. or below among them.

First electroless plating is carried out to form a first metallic deposit film (step 5). For example, using an electroless nickel solution containing a nickel salt and a hypophosphite, the electroless nickel plating is carried out. At this stage, the temperature of the electroless nickel plating solution should be kept at 75° C. or below. The temperature control of the plating solution is made, for example, by heating the solution and keeping the temperature by use of a heater. The thickness of the Ni—P film formed by the electroless nickel plating is not critical. For instance, the film is formed in a thickness smaller than of a polyimide film serving as an insulating film as in a conventional case.

Next, the semiconductor device obtained after the formation of the first metallic deposit film is cleaned with a cleaning fluid (step 6). For instance, where an Ni—P film is formed by electroless nickel plating, the device is cleaned with hot water at 65° C. or over.

Subsequently, while care should be paid so that the temperature of the semiconductor substrate, particularly, the temperatures of the organic insulating film and the first metallic deposit film are not lowered, second electroless plating is carried out (step 7). For instance, where a polyimide film and an Ni—P film are formed on the silicon substrate, the semiconductor device is transferred from the cleaning vessel to a gold plating vessel while making the temperature of the silicon substrate, particularly, the temperatures of the polyimide film and the Ni—P film, not lower than 65° C. In this case, the temperature of the gold plating vessel is maintained at 65° C. or more. The temperature control of the plating solution is carried out by heating the solution and keeping its temperature by use, for example, of a heater. After formation of an Au film by electroless gold plating, the semiconductor device is cleaned with water (step 8) to complete the electroless plating steps. It will be noted that in step 8, the temperature control is not necessary. According to these steps, the bump underlying metal film is formed on the electrode.

When the temperatures of the first plating solution, the cleaning fluid and the second plating solution are so controlled as in this embodiment, the following effects are expected.

For example, because the polyimide film has a coefficient of thermal expansion larger by one order of magnitude than the Ni—P film, the shrinking rate of the polyimide film caused by the temperature difference between the nickel plating solution and the gold plating solution is larger than that of the Ni—P film. On the other hand, conventional nickel plating has been carried out by immersion in a nickel plating solution at a temperature of about 80° C., and subsequent gold plating is effected by immersion in a gold plating solution at a temperature of about 60° C. This great temperature difference (20° C.) between the nickel plating solution and the gold plating solution leads to a great difference in volumetric shrinkage between the polyimide film and the Ni—P film, thereby causing a great internal stress to occur at the interface.

To avoid this, this embodiment is characterized in that the nickel plating is carried out by immersion in a nickel plating solution at a temperature of 75° C. or below and the gold plating is subsequently carried out by immersion in a gold plating solution at a temperature of 65° C. or over and that cleaning with water subsequent to the nickel plating is effected at a temperature of 65° C. or over. The temperature difference of the nickel plating solution, water, and the gold plating solution is set at 15° C. or below, preferably 10° C. or below, for which the temperature change given to the semiconductor device, particularly, the polyimide film and the Ni—P film, is made within 15° C., preferably within 10° C. As a result, the difference in volumetric shrinkage between the polyimide film and the Ni—P film can be made small.

The small difference in volumetric shrinkage between the polyimide film and the Ni—P film results in the small internal stress occurring at the interface between the polyimide film and the Ni—P film, so that the separation therebetwen can be prevented and, thus, the formation of an interstitial space can be prevented. This, in turn, prevents the gold plating solution from entering from the interstitial space between the polyimide film and the Ni—P film and arriving at the aluminium electrode. Thus, the aluminium electrode undergoes no corrosion with the gold plating solution.

In this embodiment, an instance of applying the first and second metallic deposits to as a bump underlying metal has been illustrated hereinabove, and the invention should not be construed as limiting to such an instance. For example, the invention may be applied to bump electrodes per se that are employed to TAB (tape automated bonding) and mounting with an anisotropic conductive film.

For the electrode of this embodiment, mention is made of an aluminium electrode and electrodes made of other types of metals may also be used so far as they have electric conductivity and are usable as an electrode. Moreover, those electrodes made of appropriate materials whose surfaces are covered with a metal may also be used.

Further, this embodiment and the first embodiment may be used in combination. The combination is more effective in preventing the corrosion of the electrode.

In the first and second embodiments, illustration has been made on the instance of a semiconductor substrate, and the invention may be applicable to a printed board. Table 1 shows the examples of essential members of the case where the invention is carried out by use of a printed substrate in comparison with the case using a semiconductor substrate.

TABLE 1

|  | First and second embodiments | Printed substrate |
| --- | --- | --- |
| Substrate | Silicon substrate | Glass epoxy substrate |
| Organic insulating film | Polyimide film | Solder resist film |
| Electrode | Aluminium electrode | Copper wiring electrode |
| First metallic deposit film | Ni—P film | Ni—P film |
| Second metallic deposit film | Au film | Au film |

For instance, a glass epoxy material is provided as a substrate, on which a copper wiring and a solder resist are formed. Next, an Ni—P film (first metallic deposit film) is formed by an electroless plating method, in which the thickness of the Ni—P film is made larger than that of the solder resist film and the Ni—P film is so formed as to be superposed on the solder resist film at a peripheral portion thereof. Thereafter, an Au film (second metallic deposit film) is formed on the Ni—P film. According to this arrangement, even if an interstitial space is established due to the separation at the interface between the solder resist film and the Ni—P film, it is prevented to permit an Au plating solution to arrive at the copper wiring electrode, thereby causing the copper wiring electrode to be corroded.

The invention can be applied to substrates other than a semiconductor substrate and a printed substrate. For instance, a metal substrate or a substrate having a metal film formed on the surface thereof is provided, and an organic insulating film having a pattern through which the metal substrate or the metal film is partly exposed is formed, after which a first metallic deposit film is formed on the metal substrate or the metal film at a portion thereof exposed from the organic insulating film according to an electroless plating method. Then a second metallic deposit film is subsequently formed on the first metallic deposit film. The invention may be applied to this case.

The features and advantages of the present invention may be summarized as follows.

According to one aspect, a first metallic deposit film formed on an organic insulating film is able to prevent a second plating solution from arriving at an electrode via an interstitial space established between the organic insulating film and the first metallic deposit film. Accordingly, the electrode is not corroded by the action of the second plating solution, thereby providing a semiconductor device having excellent electric characteristics and reliability.

According to another aspect, a gold plating solution can be prevented from arriving at an aluminium electrode via the interstitial space created between a polyimide film and a nickel deposit film. Accordingly, the electrode is not corroded by the action of the gold plating solution, thereby providing a semiconductor device having excellent electric characteristics and reliability.

For further reference, a method for manufacturing a semiconductor device, said method comprising the steps of: forming an electrode on a semiconductor substrate which has a semiconductor integrated circuit formed therein, wherein said electrode is electrically connected to said semiconductor integrated circuit; forming, on said semiconductor substrate, an organic insulating film having an opening through which said electrode is exposed; forming a bump underlying metal film, made of a first metallic deposit film and a second metallic deposit film, at said opening; and forming a bump electrode on said bump underlying metal film; according to the present invention may be summarized as follows.

According to one aspect, the method comprises the steps of: the formation of said bump underlying metal film comprises the first electroless plating step of immersing said semiconductor substrate in a first plating solution, the step of cleaning said semiconductor substrate with a cleaning fluid after the first plating step, and the second electroless plating step of immersing said semiconductor substrate in a second plating solution after the cleaning wherein a temperature difference among said first plating solution, said cleaning fluid and said second plating solution is 15° C. or below.

Preferably, said electrode consists of an aluminium electrode, said organic insulating film consists o a polyimide film, said first metallic deposit film consists of a nickel-phosphorus film, said first plating solution consists of a nickel plating solution, said second metallic deposit film consists of a gold film, said second plating solution consists of a gold plating solution, and said cleaning fluid consists of water.

Preferably, said nickel plating solution has a temperature of 75° C. or below.

Preferably, said water and said gold plating solution, respectively, have a temperature of 65° C. or over.

Preferably, the temperatures of said polyimide film and said nickel-phosphorus film are not lower than 65° C. during the course of the cleaning to the immersion in said gold plating solution.

According to one aspect, separation at the interface between the organic insulating film and the first metallic deposit film can be prevented, there by preventing the establishment of the interstitial space. Accordingly, the second plating solution does not enter from the interstitial space between the organic insulating film and the first metallic deposit film and thus, does not arrive at the electrode. The electrode does not undergo corrosion, with an improved yield.

According to another aspect, separation at the interface between the polyimide film and the Ni—P film is prevented, thereby preventing an interstitial space from being created. Accordingly, the gold plating solution does not arrive from the interstice between the polyimide film and the Ni—P film, and the aluminium electrode does undergo corrosion, with an improved yield.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2002-145333, filed on May 20, 2002 including specification, claims, drawings and summary, on which the Convention priority of the present application is based, are incorporated herein by reference in its entirety.

What is claimed is:

1. A semiconductor device comprising:

an electrode formed on a semiconductor substrate provided with a semiconductor integrated circuit and electrically connected to said semiconductor integrated circuit;

an organic insulating film formed on said semiconductor substrate and having an opening through which said electrode is exposed; and a bump electrode formed on said electrode through a bump underlying metal film;

wherein said bump underlying metal film includes a first metallic deposit film formed by a first electroless plating method and a second metallic deposit film formed on said first metallic deposit film by a second electroless plating method using a plating solution different in type from that of said first electroless plating method, said first metallic deposit film having a thickness larger than said organic insulating film, said first metallic deposit film being so formed that a peripheral portion thereof is superposed on said organic insulating film.

2. The semiconductor device according to claim 1, wherein said organic insulating film has a thickness of 3~14 $\mu$m, and said first metallic deposit film has a thickness of 4~15 $\mu$m.

3. The semiconductor device according to claim 1, wherein said electrode consists of an aluminium electrode, said organic insulating film consists of a polyimide film, said first metallic deposit film consists of a nickel-phosphorus film, and said second metallic deposit film consists of a gold film.

* * * * *

UNITED STATES PATENT AND TRADEMARK OFFICE
CERTIFICATE OF CORRECTION

PATENT NO.    : 6,686,660 B2
DATED         : February 3, 2004
INVENTOR(S)   : Yoshihiko Nemoto It is certified that error appears in the above-identified patent and that said Letters Patent is hereby corrected as shown below:

<u>Title page,</u>
Item [73], Assignee, please change "Mitsubishi Denki Kabushiki Kaisha, Tokyo (JP)" to -- Renesas Technology Corp., Tokyo (JP) --

Signed and Sealed this

Eighteenth Day of May, 2004

JON W. DUDAS
*Acting Director of the United States Patent and Trademark Office*